(12) United States Patent
Zhou et al.

(10) Patent No.: US 9,865,578 B2
(45) Date of Patent: Jan. 9, 2018

(54) METHODS OF MANUFACTURING MULTI-DIE SEMICONDUCTOR DEVICE PACKAGES AND RELATED ASSEMBLIES

(71) Applicant: Micron Technology, Inc., Boise, ID (US)

(72) Inventors: Wei Zhou, Singapore (SG); Aibin Yu, Singapore (SG); Zhaohui Ma, Singapore (SG); Sony Varghese, Boise, ID (US); Jonathan S. Hacker, Meridian, ID (US); Bret K. Street, Meridian, ID (US); Shijian Luo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/730,681

(22) Filed: Jun. 4, 2015

(65) Prior Publication Data

US 2016/0358898 A1 Dec. 8, 2016

(51) Int. Cl.
*H01L 29/40* (2006.01)
*H01L 25/18* (2006.01)
*H01L 25/065* (2006.01)
*H01L 25/00* (2006.01)
*H01L 21/56* (2006.01)
*H01L 23/00* (2006.01)
(Continued)

(52) U.S. Cl.
CPC ............ *H01L 25/18* (2013.01); *H01L 21/561* (2013.01); *H01L 21/563* (2013.01); *H01L 21/6835* (2013.01); *H01L 21/78* (2013.01); *H01L 23/3107* (2013.01); *H01L 23/3128* (2013.01); *H01L 23/544* (2013.01); *H01L 24/94* (2013.01); *H01L 24/96* (2013.01); *H01L 25/0657* (2013.01); *H01L 25/50* (2013.01);
(Continued)

(58) Field of Classification Search
CPC ... H01L 25/18; H01L 21/563; H01L 21/6835; H01L 21/78; H01L 23/3107; H01L 24/96; H01L 25/0657; H01L 25/50; H01L 2221/68359; H01L 2221/68381; H01L 2924/1431; H01L 2924/1434
USPC ........................................................ 257/777
See application file for complete search history.

(56) References Cited

U.S. PATENT DOCUMENTS 7,144,800 B2 * 12/2006 Mostafazadeh ....... H01L 21/561
257/666
7,910,385 B2 * 3/2011 Kweon .................. H01L 21/561
257/48
(Continued)

OTHER PUBLICATIONS

Zhaohui et al., U.S. Appl. No. 14/325,619, filed Jul. 8, 2014, for •Semiconductor Devices Comprising Protected Side Surfaces and Related Methods•.

*Primary Examiner* — Vu A Vu
(74) *Attorney, Agent, or Firm* — TraskBritt

(57) ABSTRACT

Methods of making semiconductor device packages may involve attaching a first semiconductor die to a carrier wafer, an inactive surface of the first semiconductor die facing the carrier wafer. One or more additional semiconductor die may be stacked on the first semiconductor die on a side of the first semiconductor die opposite the carrier wafer to form a stack of semiconductor dice. A protective material may be positioned over the stack of semiconductor dice, a portion of the protective material extending along side surfaces of the first semiconductor die to a location proximate the inactive surface of the first semiconductor die. The carrier wafer may be detached from the first semiconductor die.

21 Claims, 5 Drawing Sheets

(51) Int. Cl.
*H01L 23/31* (2006.01)
*H01L 23/544* (2006.01)
*H01L 21/683* (2006.01)
*H01L 21/78* (2006.01)

(52) U.S. Cl.
CPC ............ *H01L 2221/68359* (2013.01); *H01L 2221/68381* (2013.01); *H01L 2223/54433* (2013.01); *H01L 2223/54486* (2013.01); *H01L 2224/16145* (2013.01); *H01L 2224/32145* (2013.01); *H01L 2224/73204* (2013.01); *H01L 2224/94* (2013.01); *H01L 2224/97* (2013.01); *H01L 2225/06513* (2013.01); *H01L 2225/06541* (2013.01); *H01L 2924/1431* (2013.01); *H01L 2924/1434* (2013.01); *H01L 2924/18161* (2013.01)

(56) References Cited

U.S. PATENT DOCUMENTS

| | | | |
|---|---|---|---|
| 8,357,564 B2 * | 1/2013 | Chi | H01L 21/4832 257/676 |
| 8,552,567 B2 | 10/2013 | England et al. | |
| 8,937,309 B2 | 1/2015 | England et al. | |
| 2002/0048889 A1 | 4/2002 | Hayama et al. | |
| 2004/0036167 A1 | 2/2004 | Sugiyama et al. | |
| 2006/0276009 A1 | 12/2006 | Kurogi | |
| 2008/0315372 A1 | 12/2008 | Kuan et al. | |
| 2008/0315375 A1 * | 12/2008 | Eichelberger | H01L 21/6835 257/659 |
| 2009/0243097 A1 | 10/2009 | Koroku et al. | |
| 2011/0080384 A1 * | 4/2011 | Liu | G02F 1/167 345/204 |
| 2011/0186910 A1 * | 8/2011 | Forrest | H01L 21/7813 257/190 |
| 2012/0038045 A1 | 2/2012 | Lee | |
| 2012/0088332 A1 | 4/2012 | Lee et al. | |
| 2013/0075895 A1 | 3/2013 | Miura et al. | |
| 2013/0328177 A1 * | 12/2013 | Cho | H01L 21/565 257/659 |
| 2014/0054796 A1 | 2/2014 | Gong et al. | |
| 2014/0091473 A1 * | 4/2014 | Len | H01L 25/0652 257/774 |
| 2014/0237307 A1 * | 8/2014 | Kobla | G11C 29/18 714/723 |
| 2015/0108424 A1 * | 4/2015 | Huang | H01L 33/22 257/13 |
| 2016/0013154 A1 | 1/2016 | Ma et al. | |

* cited by examiner

METHODS OF MANUFACTURING MULTI-DIE SEMICONDUCTOR DEVICE PACKAGES AND RELATED ASSEMBLIES

CROSS-REFERENCE TO RELATED APPLICATION

The subject matter of this application is related to the subject matter of U.S. patent application Ser. No. 14/325,619, filed Jul. 8, 2014, for "SEMICONDUCTOR DEVICES COMPRISING PROTECTED SIDE SURFACES AND RELATED METHODS," the disclosure of which is incorporated herein in its entirety by this reference.

FIELD

This disclosure relates generally to semiconductor device packages and methods of manufacturing semiconductor device packages. More specifically, disclosed embodiments relate to methods of manufacturing multi-die semiconductor device packages using a base, singulated semiconductor die supported by a carrier.

BACKGROUND

Semiconductor wafers including die locations on their active surfaces may be relatively thin and brittle, lacking any substantial strength, particularly against bending stresses, which may result from the use of such wafers in processes to fabricate and encapsulate stacked multi-die semiconductor packages. To mechanically support a semiconductor wafer, which may be characterized as a "base wafer," while individual semiconductor dice are stacked on these die locations to form multi-die semiconductor device assemblies, the semiconductor wafer may be attached to a carrier wafer providing physical support, for example, by positioning an attachment material between the semiconductor wafer and the carrier wafer. Such a carrier wafer is also required due to the inability of wafer handling equipment to handle such a thin base wafer. Subsequently, the active surface of the base wafer and stacks of semiconductor dice thereon may be encapsulated in a protective material, for example, a dielectric molding material. After encapsulation, the carrier wafer may be detached from the semiconductor wafer. For example, the attachment material may be weakened by heating, and the semiconductor wafer and carrier wafer may be slid laterally relative to one another until the carrier wafer is removed. As another example, a laser may be used to heat and ablate the attachment material. As yet another example, a solvent may be used to dissolve portions of the attachment material, and the carrier wafer may be physically pulled away from the semiconductor wafer. Individual semiconductor device packages comprising the stacked, encapsulated semiconductor dice and a semiconductor die singulated from the semiconductor wafer may be formed by cutting through the protective material between the die stacks and through the semiconductor wafer along so-called "streets" between the die locations to "singulate" the semiconductor device packages.

Such methods employing a carrier wafer supporting a base wafer can result in damage to the base wafer due to excessive wafer warpage resulting from the molding process employed to encapsulate a large number of die stacks on the base wafer. Further, debonding of a carrier wafer from the molded wafer assembly is costly.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

The illustrations presented in this disclosure are not meant to be actual views of any particular wafer, semiconductor device package, component thereof, or act in a method of manufacturing a semiconductor device package, but are merely idealized representations employed to describe illustrative embodiments. Thus, the drawings are not necessarily to scale.

Disclosed embodiments relate generally to methods of manufacturing semiconductor device packages. More specifically, disclosed are embodiments of methods of manufacturing stacked multi-die semiconductor device packages using singulated base dice supported by a carrier structure. Such methods may eliminate the need for conventional wafer-level removal of a carrier wafer from an unsingulated base semiconductor wafer used to form a number of stacked multi-die semiconductor device packages and including die locations on its active surface from which base dice are singulated.

Figure 1:
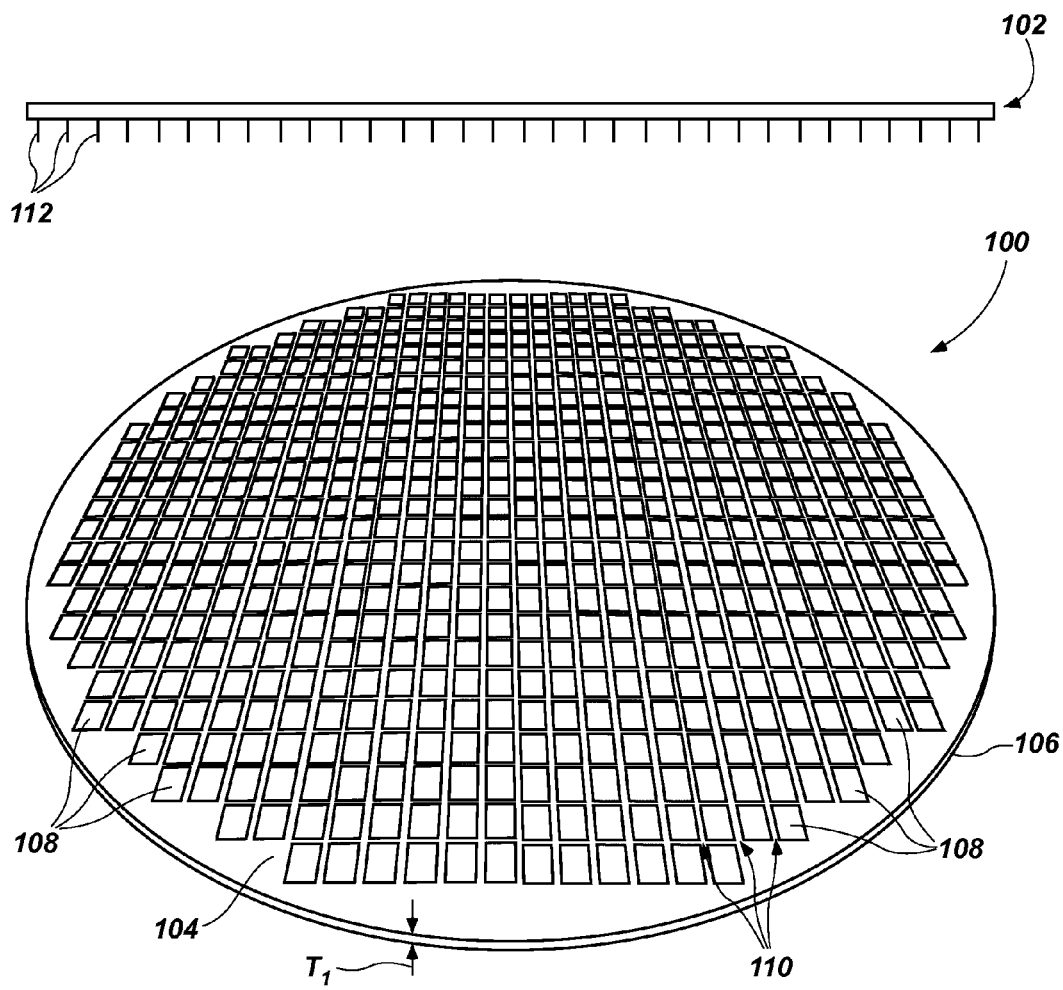
FIG. 1 is a perspective view of a semiconductor wafer and a simplified view of a probe testing apparatus.

Referring to FIG. 1, a perspective view of a semiconductor wafer 100 and a simplified view of a testing apparatus 102 are shown. The semiconductor wafer 100 may comprise a semiconductor material, such as, for example silicon. The semiconductor wafer 100 may include an active surface 104, which may have integrated circuitry formed therein, and an inactive surface 106 on a side of the semiconductor wafer 100 opposite the active surface 104. A plurality of laterally separated die locations 108 may be located on the active surface 104 of the semiconductor wafer 100. Streets 110 may be located between the die locations 108. Each die location 108 may correspond to a discrete semiconductor die configured to perform a predefined function or functions, and may have, for example, a rectangular (e.g., a square)

shape. The active and inactive surfaces 104 and 106 of semiconductor wafer 100 may be at least substantially circular in shape, in some embodiments, as known to those of ordinary skill in the art. A thickness $T_1$ of the semiconductor wafer 100 may be, for example, about 200 µm or less. More specifically, the thickness $T_1$ of the semiconductor wafer 100 may be, for example, about 100 µm or less. As a specific, nonlimiting example, the thickness $T_1$ of the semiconductor wafer 100 may be about 50 µm or less.

In some embodiments, each die location 108 on the active surface 104 of the semiconductor wafer 100 may be tested to determine whether it is functional or nonfunctional. For example, a testing apparatus 102 comprising probes 112 may be positioned proximate the active surface 104 of the semiconductor wafer 100. The probes 112 may contact and electrically connect to one or more bond pads 122 (see FIG. 2) of each die location 108 on the active surface 104 of the semiconductor wafer 100. The testing apparatus 102 may be used to send electrical signals through some of the probes 112 to each die location 108 and measure the response of each die location 108 by evaluating electrical signals, or the lack thereof, at other probes 112. The probes 112 may be positioned at known locations on the testing apparatus 102 assigned to bond pads of one or more known die locations 108 to enable a person or machine evaluating the results of the test to identify which die locations 108 are functional and which die locations 108 are nonfunctional.

Figure 2:
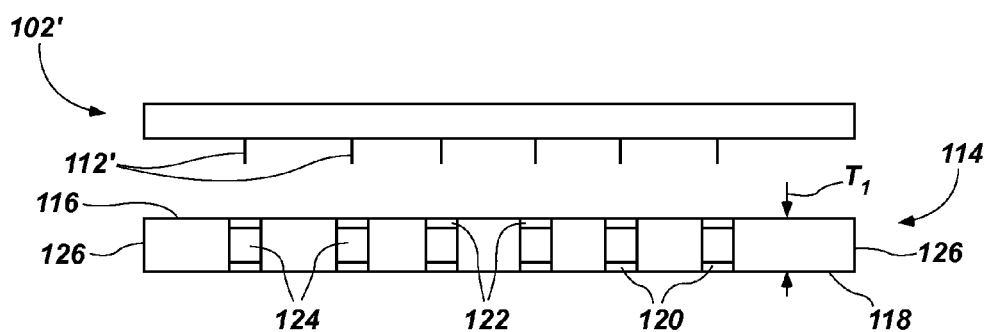
FIG. 2 is a cross-sectional view of a semiconductor die from the semiconductor wafer of FIG. 1.

FIG. 2 is a cross-sectional view of a semiconductor die 114 from the semiconductor wafer 100 of FIG. 1. The semiconductor die 114 may correspond to one of the die locations 108 (see FIG. 1) of the semiconductor wafer 100 (see FIG. 1). The semiconductor die 114 may be singulated from the semiconductor wafer 100 (see FIG. 1) by cutting along the streets 110 (see FIG. 1) utilizing a singulation apparatus, which may include a frame for supporting the semiconductor wafer 100 (see FIG. 1) and saws carrying rotatable saw blades for cutting through material of the semiconductor wafer 100 (see FIG. 1) along the streets 110 (see FIG. 1).

The semiconductor die 114 may include, for example, an active surface 116 and including integrated circuitry thereon and an inactive surface 118 on a side of the semiconductor die 114 opposite the active surface 116. The active and inactive surfaces 116 and 118 may be, for example, rectangular (e.g., square) in some embodiments. In some embodiments, the semiconductor die 114 may be a logic die and the integrated circuitry may be logic circuitry configured to, for example, control memory devices and exchange information to and from the memory devices when operatively connected to another device or system. In other embodiments, semiconductor die 114 may be a so-called "system on a chip" or "SoC" die including a microprocessor, memory, clock, power management, and other functions. Side surfaces 126 defining a periphery of the semiconductor die 114 may extend between the active surface 116 and the inactive surface 118. The semiconductor die 114 may include terminals 120 of electrically conductive material at the inactive surface 118 and bond pads 122 of electrically conductive material at the active surface 116. The bond pads 122 may be electrically connected to the integrated circuitry of the active surface 116, for example, by traces extending from the bond pads 122, along the active surface 116 and under a passivation material, to the integrated circuitry. Vias 124 extending through the thickness $T_1$ of the semiconductor die 114 may electrically connect the bond pads 122 to the terminals 120. The vias 124 may include, for example, one or more electrically conductive materials extending from the bond pads 122 to the terminals 120, an electrically insulating material isolating the electrically conductive material from surrounding semiconductor material of the semiconductor die 114 and a barrier material to prevent migration of the one or more conductive materials into the semiconductor material of the semiconductor die 114.

In embodiments where testing takes place at the wafer level, only those semiconductor dice 114 known to be functional may be selected to continue along the manufacturing process flow. Nonfunctional semiconductor dice may be, for example, discarded or further inspected to determine the cause of the defect and if a potential repair is available. In other embodiments, testing may not take place at the wafer level. Rather, each individual semiconductor die 114 may be tested for functionality. For example, a testing apparatus 102' comprising probes 112' may be positioned proximate the active surface 116 of the semiconductor die 114. The probes 112' may contact and electrically connect to one or more bond pads 122 of the semiconductor die 114. The testing apparatus 102' may send electrical signals through some of the probes 112' to integrated circuitry of the semiconductor die 114 and measure the response of the integrated circuitry by evaluating electrical signals, or the lack thereof, at other probes 112'. The probes 112' may be at known locations on the testing apparatus 102' corresponding to known locations of bond pads 122 of the semiconductor die 114. If the semiconductor die 114 is functional, it may be selected to continue along the manufacturing process flow. Nonfunctional semiconductor dice may be, for example, discarded or further inspected to determine the cause of the defect.

Figure 3:
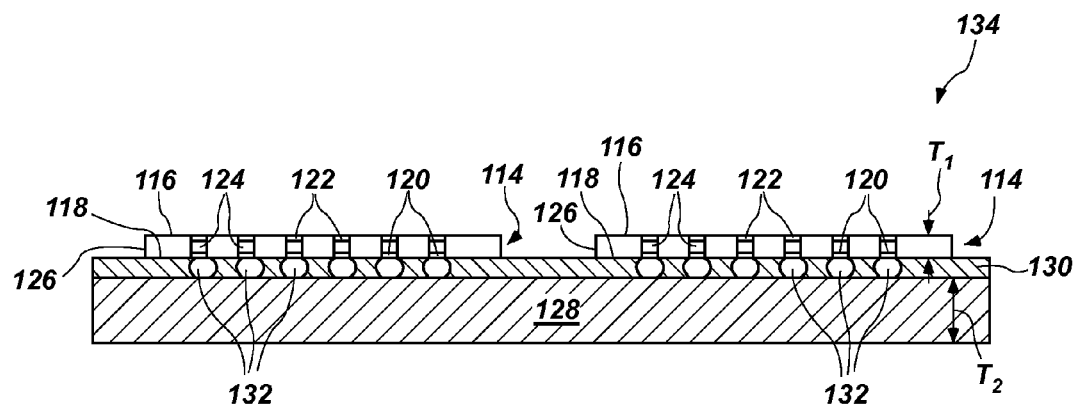
FIG. 3 is a cross-sectional view of a first stage in an embodiment of a process of manufacturing semiconductor device packages.
Figure 10:
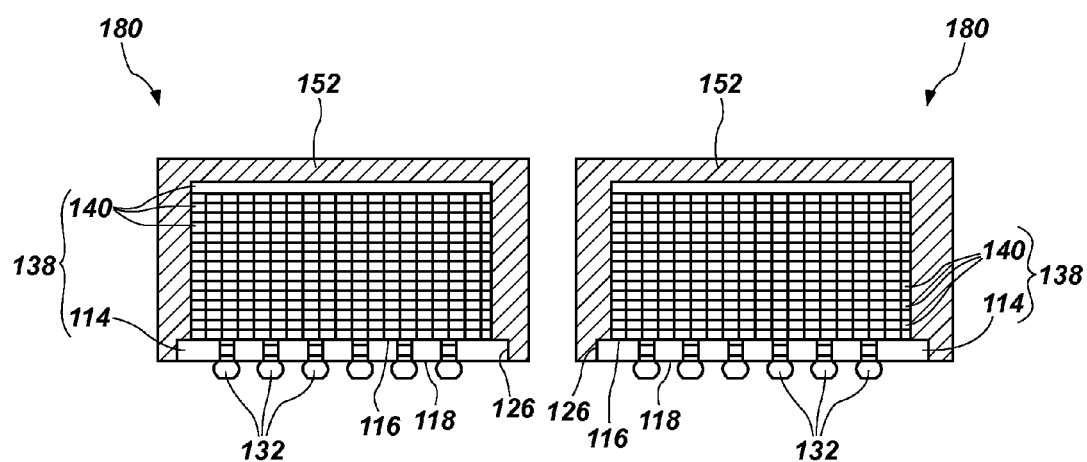
FIG. 10 is a cross-sectional view of semiconductor device packages formed in accordance with embodiments of this disclosure.

FIG. 3 is a cross-sectional view of a first stage 134 in a process of manufacturing semiconductor device packages 180 (see FIG. 10). Pre-singulated, known-to-be-functional semiconductor dice 114, which are typically characterized as "known good die" or "KGD," may be attached to a carrier wafer 128 a laterally spaced locations. The inactive surfaces 118 of the semiconductor dice 114 may face a supporting carrier wafer 128, and the active surfaces 116 of the semiconductor dice 114 may be located on sides of the semiconductor dice 114 opposite the carrier wafer 128. The semiconductor dice 114 may be referred to as the "first," or "base," semiconductor dice 114. Attaching individual semiconductor dice 114 to the carrier wafer 128, rather than attaching an entire semiconductor wafer 100 (see FIG. 1), may waste fewer resources because only this semiconductor dice 114 known to be functional may be selected for attachment to the carrier wafer 128 and for use of further resources in the process flow. In addition, attaching individual semiconductor dice 114 to the carrier wafer 128 may cause fewer defects to be introduced into the semiconductor dice 114 when compared to attaching an entire semiconductor wafer 100 (see FIG. 1) to a carrier wafer 128 because any potential warping resulting from processing occurs on a much smaller scale (i.e., over the markedly smaller lateral dimensions of the individual, laterally separated semiconductor die 114 when compared to the entire, unsingulated semiconductor wafer 100 (see FIG. 1)) and because forces of handling, processing, and separation act primarily on the carrier wafer 128 and any supporting materials such as a molded encapsulant, rather than acting on the semiconductor wafer 100 (see FIG. 1).

The carrier wafer 128 may be configured as a support structure to reinforce and protect the first semiconductor dice 114 during subsequent processing and handling. The carrier wafer 128 may be of substantially circular shape, as with conventional semiconductor wafers, or may be of some other shape, such as rectangular, hexagonal or octagonal. Thus, the term "wafer as used to identify the carrier structure is one of convenience and not limitation. The carrier wafer 128 may exhibit sufficient strength and rigidity to perform such a function. A material of the carrier wafer 128 providing such strength and rigidity may comprise, for example, a semiconductor material (e.g., silicon), a ceramic material (e.g., aluminum oxide or silicon oxide), a mineral (e.g., sapphire), or a glass. A thickness $T_2$ of the carrier wafer 128 may be greater than the thickness $T_1$ of the first semiconductor dice 114. For example, the thickness $T_2$ of the carrier wafer 128 may be at least two times greater than the thickness $T_1$ of the first semiconductor dice 114. More specifically, the thickness $T_2$ of the carrier wafer 128 may be, for example, about 500 µm or greater. As specific, nonlimiting examples, the thickness $T_2$ of the carrier wafer 128 may be about 600 µm or greater or about 700 µm or greater, the desired thickness to provide adequate strength and rigidity being, of course, dependent upon the material properties of the carrier wafer 128.

The first semiconductor dice 114 may be attached to the carrier wafer 128 by, for example, an attachment material 130 located between the semiconductor dice 114 and the carrier substrate 128. The attachment material 130 may be, for example, a thermoplastic material configured to withstand high temperatures without degrading. More specifically, the attachment material 130 may be, for example, a polyethylene material or a wax material configured to withstand temperatures of about 150° C. or higher for a period of time without experiencing degradation. As a specific, nonlimiting example, the attachment material 130 may be configured as an adhesive film or tape of low-molecular-weight polyethylene or high-temperature wax configured to withstand temperatures of about 170° C. or higher for a period of time without experiencing degradation. The attachment material 130 may be dissolvable by a solvent in some embodiments. For example, the attachment material 130 may be dissolvable in toluene or xylene.

Conductive elements 132 of an electrically conductive material may be embedded within the attachment material 130 at locations for receiving the first semiconductor dice 114 thereon. The conductive elements 132 may be configured as, for example, bumps, balls, columns, or pillars of a flowable, electrically conductive material (e.g., solder). The conductive elements 132 may be positioned in repeating patterns at locations on carrier wafer 128 corresponding to locations of the terminals 120 of the first semiconductor dice 114. When the first semiconductor dice 114 are attached to the carrier substrate 128, the terminals 120 of each base semiconductor die 114 may align with conductive elements 132 laterally surrounded by the attachment material 130. More specifically, the terminals 120 of each first semiconductor die 114 may be in contact with the conductive elements 132. Precise placement of the first semiconductor dice 114 relative to the conductive elements 132 may be accomplished using conventional surface mount technology component placement systems, commonly referred to as "pick-and-place" machines. It should be noted that terminals 120 of each base semiconductor die 114 may be located in direct alignment with vias 124, or may be located at more widely spaced intervals, also termed "pitch," and connected to vias 124 by conductive traces of a so-called "redistribution layer" (RDL) extending over inactive surface 118.

Figure 4:
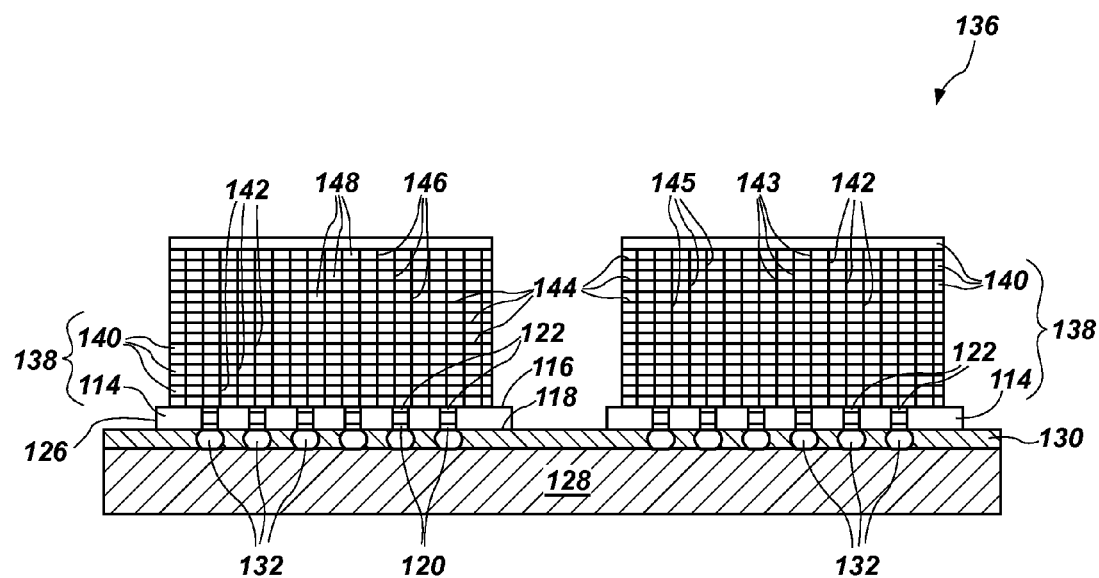
FIG. 4 is a cross-sectional view of a second stage in the embodiment of a process of manufacturing semiconductor device packages.

FIG. 4 is a cross-sectional view of a second stage 136 in the process of manufacturing semiconductor device packages 180 (see FIG. 10). A stack of semiconductor dice 138 may be formed at a location of each first semiconductor die 114 by stacking at least a second, additional semiconductor die 140 on a side of the first semiconductor die 114 opposite the carrier substrate 128. For example, a number of additional semiconductor dice 140 in the stack of semiconductor dice 138 may be four or more. More specifically, the number of additional semiconductor dice 140 in the stack of semiconductor dice 138 may be, for example, eight, twelve, sixteen, or more. Each of the additional semiconductor dice 140 may have been previously tested and qualified as known good die, as with first semiconductor dice 114. A surface area of each major surface of the additional semiconductor dice 140 (e.g., active and inactive surfaces) may be less than a surface area of each of the active and inactive surfaces 116 and 118 of the first semiconductor die 114. The first semiconductor die 114 may project laterally from the periphery of additional semiconductor dice 140, such that a portion of the active surface 116 of the first semiconductor die 114 is exposed laterally beyond the peripheries of the additional semiconductor dice 140 stacked thereon, providing what may be characterized as a shelf or a shoulder at the base of the additional semiconductor dice 140 in the stack. In some embodiments, each additional semiconductor die 140 may be a memory device, for example a dynamic random access memory, or DRAM. In such embodiments, the memory devices of the additional semiconductor dice 140 and the logic or SoC integrated circuitry of the first semiconductor die 114 may cooperatively form a memory module or system module to be connected to another device or system through higher-level packaging such as, for example, a motherboard.

The additional semiconductor dice 140 may be electrically interconnected to one another and to the first semiconductor die 114. For example, at least one of the additional semiconductor dice 140 may include electrically conductive vias 142, which may be configured in at least substantially the same manner described previously with regard to the vias 124 of the first semiconductor die 114, extending through the semiconductor dice 140 in a direction at least substantially perpendicular to active surfaces 144 of the additional semiconductor dice 140 and in the same pitch and pattern as vias 124. Vias 142 extend between bond pads 143 on an active surface of an additional semiconductor die 140 and terminals 145 on an opposing, inactive surface. Conductive structures 146 may be located between each adjacent additional semiconductor die 140 and between bond pads 124 of the first semiconductor die 114 and terminals 145 of the adjacent second semiconductor die 140. The conductive structures 146, may be formed on terminals 145 of each additional semiconductor die 140 and configured as, for example, bumps, balls, columns, or pillars of an electrically conductive material. In one embodiment, copper pillars may be employed as conductive structures 146. An underfill material 148 may be located between each adjacent additional semiconductor die 140 and between the first semiconductor die 114 and the adjacent second semiconductor die 140, may laterally surround the conductive structures 146, and extend to a lateral periphery of additional, stacked semiconductor dice 140. The underfill material may be, for example, a dielectric capillary underfill, pre-applied non-conductive paste, non-conductive film, wafer-level underfill (WLUF), or molded underfill. The conductive structures 146 may be physically and electrically connected between adjacent additional semiconductor die 140 and between first semiconductor die 114 and an adjacent additional semiconductor die 114 by, for example, thermocompression bonding.

Each additional semiconductor die 140 may be located to align its vias 142 with the adjacent conductive structures 146, underfill material 148 may be flowed into the space between each adjacent semiconductor die 140 and the first semiconductor die 114, and pressure may be applied to each additional semiconductor die 140 at elevated temperature to bond conductive structures 146, causing each to physically and electrically connect to immediately adjacent contacting vias 124 and 142, bond pads 122 and 143, and terminals 120 and 145. The process of securing and electrically connecting additional semiconductor dice 140 to form the stack 138 may be accomplished all at once, including each additional semiconductor die 140, or one additional semiconductor die 140 at a time. Reflow of conductive elements 132 to connect to terminals 120 of first semiconductor dice 114 may be accomplished simultaneously with conductive structure bonding, or by a separate heating operation.

While the foregoing embodiment has been described using a base semiconductor die 114 and additional semiconductor dice 140 stacked thereon with active surfaces of all of the dice facing away from carrier wafer 128, it will be appreciated and understood by those of ordinary skill in the art that the disclosure is not so limited, and such stacked semiconductor die assemblies may be formed with one, some, or all of the active surfaces facing the carrier wafer 128.

Figure 5:
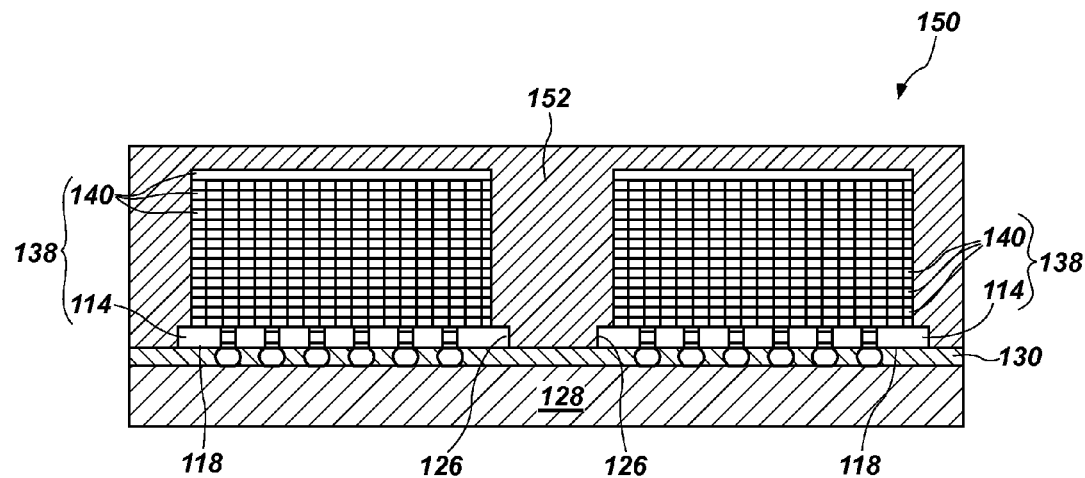
FIG. 5 is a cross-sectional view of a third stage in the embodiment of a process of manufacturing semiconductor device packages.

FIG. 5 is a cross-sectional view of a third stage 150 in the process of manufacturing semiconductor device packages 180 (see FIG. 10). A protective dielectric material 152 may be positioned over the stack of semiconductor dice 138, and a portion of the protective material 152 may extend along side surfaces 126 of each first semiconductor die 114 proximate the inactive surface 118. More specifically, the protective material 152 may extend over a top surface of a topmost semiconductor die 140 in each stack 138, along and around sides of the additional semiconductor dice 140 in each stack, over the projecting peripheral shoulder of the first semiconductor die 114 and along and in contact with side surfaces 126 of the first semiconductor die 114 in each stack 138, terminating at an interface between the inactive surface 118 of the first semiconductor die 114 and the attachment material 130 and abutting an exposed surface of the attachment material 130. The protective material 152 may be, for example, a thermoset material not dissolvable by solvents that may dissolve the attachment material 130. More specifically, the protective material 152 may be a dielectric overmold or encapsulant material dispensable into position in a flowable state and subsequently cured or otherwise solidified. As specific, nonlimiting examples, the protective material 152 may be liquid compound R4502-H1 or R4502-A1, available from Nagase ChemteX Corp. of Osaka, Japan; granular compound X89279, available from Sumitomo Corp. of Tokyo, Japan; powder compound GE-100-PWL2-imp1c from Hitachi Chemical Co., Ltd. of Tokyo, Japan; granular compound XKE G7176, available from Kyocera Chemical Corp. of Kawaguchi, Japan; or sheet compound SINR DF5770M9 or SMC-851 from Shin-Etsu Chemical Co. of Tokyo, Japan.

Figure 6:
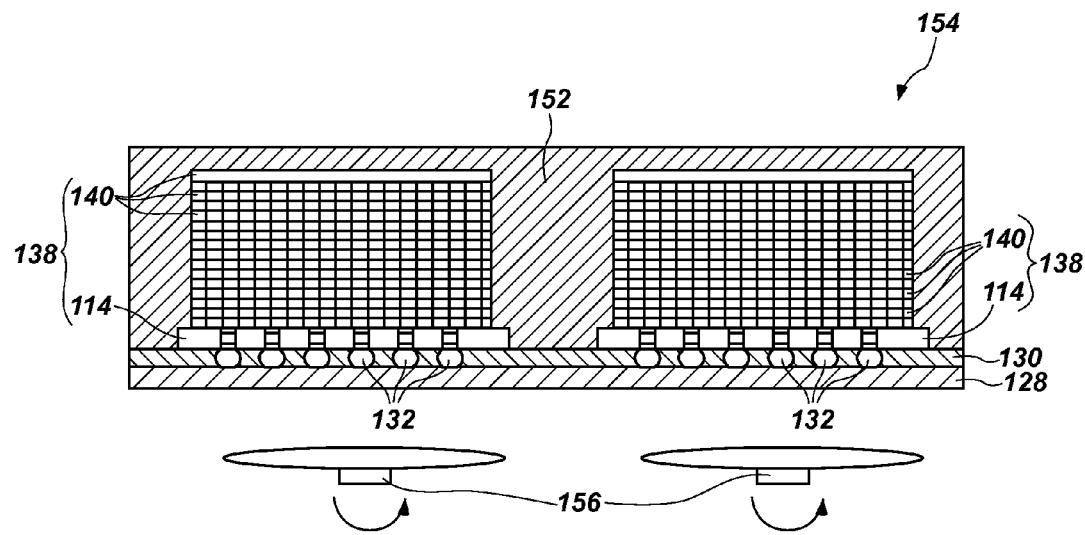
FIG. 6 is a cross-sectional view of a fourth stage in the embodiment of a process of manufacturing semiconductor device packages.

FIG. 6 is a cross-sectional view of a fourth stage 154 in the process of manufacturing semiconductor device packages 180 (see FIG. 10), in which the carrier wafer 128 may be detached from each stack of semiconductor dice 138. In some embodiments, the carrier wafer 128 may be detached from each stack of semiconductor dice 138 in a destructive process, by physically eliminating the carrier wafer 128. For example, the carrier wafer 128 may be detached from each stack of semiconductor dice 138 by first removing a portion of the carrier wafer 128 at a first rate of removal. More specifically, a portion of the carrier wafer 128 may be removed by grinding away material of the carrier wafer 128 in a so-called "back-grinding" process from a side of the carrier wafer 128 opposite the first semiconductor die 114 utilizing a conventional back-grinding apparatus 156. In some embodiments, about 50% or more of the thickness $T_2$ (see FIG. 3) of the carrier wafer 128 may be so removed. For example, more than about 75% or more of the thickness $T_2$ (see FIG. 3) of the carrier wafer 128 may be so removed. At least another portion of the carrier wafer 128 of a thickness greater than a height of conductive elements 132 may remain attached to each stack of semiconductor dice 138 to substantially reduce, if not eliminate, the likelihood that the back-grinding apparatus 156 will contact, and potentially damage, the conductive elements 132.

Figure 7:
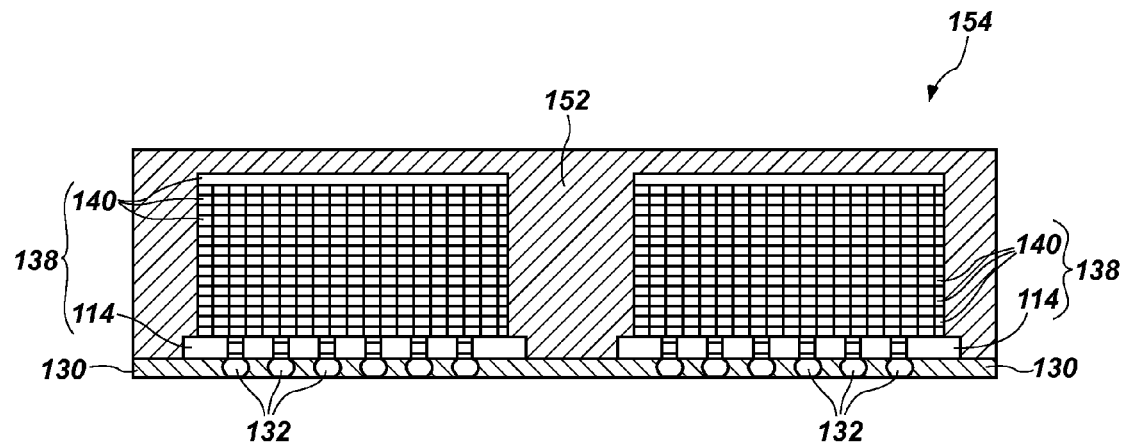
FIG. 7 is a cross-sectional view continuing the fourth stage in the embodiment of a process of manufacturing semiconductor device packages.

FIG. 7 is a cross-sectional view continuing the fourth stage 154 in the process of manufacturing semiconductor device packages 180 (see FIG. 10). After removing a portion of the carrier wafer 128 (see FIG. 6) a second portion of the carrier wafer 128 (see FIG. 6) may be removed at a second, different rate of removal. For example, the remainder of the carrier wafer 128 may be removed by etching (e.g., dry or wet etching) away material of the carrier wafer utilizing a conventional etching process, which removal may be accomplished at a slower rate than grinding. As a result, the attachment material 130 and, optionally, portions of the conductive elements 132 may be exposed on a side of the stack of semiconductor dice 138 opposite the protective material 152. The forces acting on the semiconductor dice 114 in such destructive, two-stage carrier-wafer-removal processes may be significantly less than the forces acting on a semiconductor wafer 100 (see FIG. 1) using conventional carrier-wafer-removal processes.

Figure 8:
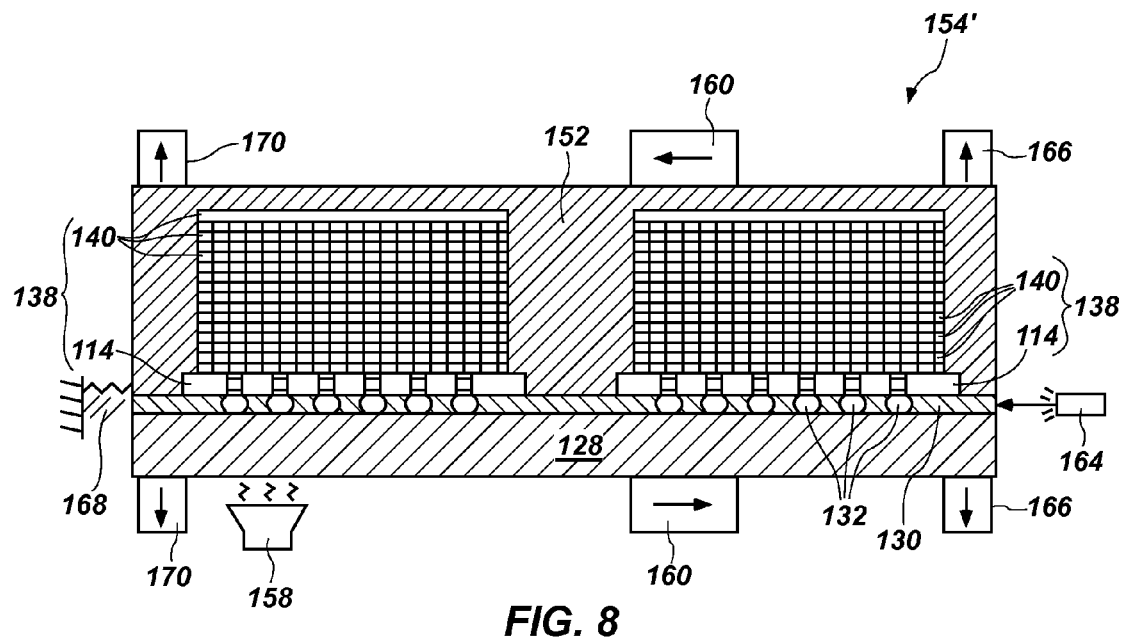
FIG. 8 is a cross-sectional view of other embodiments of a fourth stage in a process of manufacturing semiconductor device packages.

FIG. 8 is a cross-sectional view of other embodiments of the fourth stage 154' in the process of manufacturing semiconductor device packages 180 (see FIG. 10). In such embodiments, the carrier wafer 128 may be detached from each stack of semiconductor dice 138 in a nondestructive process, preserving the carrier wafer 128 for potential reuse. For example, the carrier wafer 128 may be detached from each stack of semiconductor dice 138 by thermal sliding. More specifically, the carrier wafer 128, stacks of semiconductor dice 138, protective material 152, and attachment material 130 may be, for example, exposed to an elevated temperature produced by a heat source 158 to weaken the attachment material 130 and the stacks of semiconductor dice 138 may be slid relative to the carrier wafer 128 using gripping devices 160 (e.g., wafer handlers) acting on the encapsulated stacks of semiconductor dice 138 and carrier wafer 128. As a specific, nonlimiting example, attachment material 130 may be weakened by exposure to temperatures of about 220° C. or more and the carrier wafer 128 may be moved laterally with respect to the stacks of semiconductor dice 138 encapsulated in protective material 152 to detach the carrier wafer 128 from the stacks of semiconductor dice 138.

As another example, the carrier wafer 128 may be detached from each stack of semiconductor dice 138 by laser debonding. More specifically, a laser 164 may be used to ablate, for example, at least a portion of the attachment material 130 to weaken the attachment between the stacks of semiconductor dice 138 and the carrier wafer 128, and the carrier wafer 128 may be forcefully pulled away from the stacks of semiconductor dice 138 utilizing gripping devices 166 (e.g., vacuum wafer handlers). As a specific, nonlimiting example, the laser 164 may ablate a portion of the attachment material 130 around a periphery of the carrier wafer 128 to reduce the likelihood that the laser 164 will damage any conductive elements 132, and the carrier wafer 128 may be peeled or stripped away from the stacks of semiconductor dice 138.

As yet another example, the carrier wafer may be detached from each stack of semiconductor dice 138 by chemical removal. More specifically, at least a portion of the attachment material 130 may be exposed to a weakening material 168 to weaken the attachment between the stacks of semiconductor dice 138 and the carrier wafer 128, and the carrier wafer 128 may be forcefully pulled away from the stacks of semiconductor dice 138 utilizing gripping devices 170 (e.g., vacuum wafer handlers). As a specific, nonlimiting example, the attachment material 130 may positioned in a solvent bath to dissolve at least a portion of the attachment material 130 around a periphery of the carrier wafer 128, and the carrier wafer 128 may be peeled or stripped away from the stacks of semiconductor dice 138.

In embodiments where the carrier wafer 128 is detached from the stacks of semiconductor dice 138 without destroying or significantly damaging the carrier wafer 128, the carrier wafer 128 may be reused to form additional semiconductor device packages 180 (see FIG. 10). For example, after detaching the carrier wafer 128 from the stacks of semiconductor dice 138, new patterns of conductive elements 132 arranged and pitched to correspond to terminals 120 of first semiconductor dice 114 may be set and attached to the carrier wafer, which process may be at least substantially the same as the process described previously in connection with FIG. 3.

In addition, defects introduced into the stacks of semiconductor dice 138, and particularly into the first semiconductor dice 114, by the chip-level removal of the carrier wafer 128 may be significantly reduced relative to wafer-level removal of a carrier substrate in a conventional process. In embodiments of the disclosure, stresses and resultant strains are not induced over a large, continuous surface area (e.g., on a wafer-level scale) but, rather, on much smaller, mutually physically isolated (by intervening protective material 152) semiconductor dice 114, which reduces the destructive potential. Further, during all the acts involved in implementing embodiments of the disclosure, the discontinuous nature of the level of first semiconductor dice 114 allows tolerance of much higher warpage of the overall assembly comprising stacks 138 as attached to carrier substrate 128 without detrimental effect.

Figure 9:
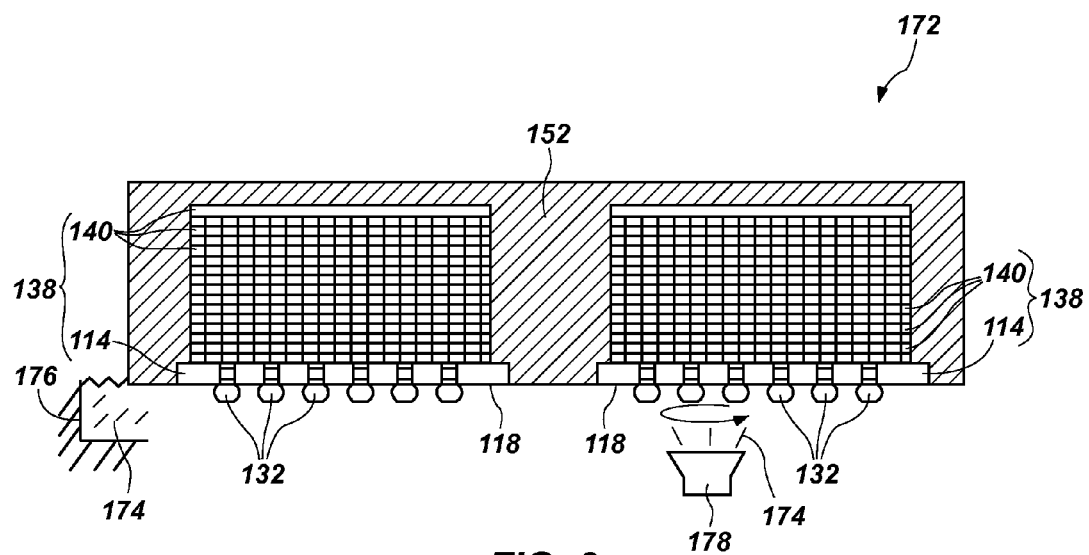
FIG. 9 is a cross-sectional view of a fifth stage in the embodiment of a process of manufacturing semiconductor device packages.

FIG. 9 is a cross-sectional view of a fifth stage 172 in the process of manufacturing semiconductor device packages 180 (see FIG. 10). The attachment material 130 (see FIG. 8) may be removed from each stack of semiconductor dice 138. For example, the attachment material 130 (see FIG. 8) may be dissolvable in a solvent material 174, which may not dissolve or otherwise damage the protective material 152, conductive elements 132, or material of the first semiconductor die 114 in each stack of semiconductor dice 138. More specifically, the attachment material 130 (see FIG. 8) may be removed by, for example, immersing at least the attachment material 130 (see FIG. 8) in a bath 176 containing the solvent material 174 or spin coating the solvent material 174 on the attachment material 130 (see FIG. 8) by dispensing the solvent material 174 thereon utilizing a dispenser 178 and spinning the attachment material to distribute the solvent material 174. Removal of the attachment material 130 (see FIG. 8) may expose the conductive elements 132, the inactive surfaces 118 of the first semiconductor die 114 of each stack of semiconductor dice 138, and portions of the protective material 152 located between adjacent stacks of semiconductor dice 138.

In other words, methods of making semiconductor device packages may involve attaching a first semiconductor die to a carrier wafer with an attachment material. At least one additional semiconductor die may be stacked on the first semiconductor die on a side of the first semiconductor die opposite the carrier. A protective material may be positioned over at least sides of the stack of semiconductor dice, a portion of the protective material extending along all side surfaces of the at least one additional semiconductor die and along side surfaces of the first semiconductor die to a location in contact with the attachment material at least proximate a surface of the first semiconductor die facing the carrier wafer. The carrier wafer may be detached from the first semiconductor die.

FIG. 10 is a cross-sectional view of semiconductor device packages 180 formed in accordance with this disclosure. Each stack of semiconductor dice 138 may be separated from each other stack of semiconductor dice 138 encapsulated in and mutually connected only by common protective material 152, as depicted in FIG. 9. For example, a cutting apparatus may cut through the protective material 152 at a distance from the side surfaces 126 of the first semiconductor die 114 of each stack of semiconductor dice 138 and between adjacent first semiconductor dice 114. Notably, such cutting may be effected from the inactive side of first semiconductor dice 114 by inverting the stacks 138 of semiconductor dice and cutting downwardly between the stacks 138 and only through protective material 152, substantially eliminating any stress on the semiconductor dice 114 and 140 and on conductive elements 132. Such an approach contrasts favorably with the cutting stress applied directly to a base semiconductor wafer having stacks of additional encapsulated semiconductor dice thereon. When singulating each stack of semiconductor dice 138 from each other stack of semiconductor dice 138, the cutting apparatus may cut through only protective material 152, such that the cutting apparatus does not cut through or otherwise contact semiconductor material of the first semiconductor die 114 or material of the carrier wafer 128 (see FIGS. 3-6, 8). Separating each stack of semiconductor dice 138 from each other stack of semiconductor dice 138 may involve removing a portion of the protective material 152 proximate a periphery of the first semiconductor die 114 of each stack of semiconductor dice 138. Another portion of the protective material 152 may remain on the side surfaces 126 of the first semiconductor die 114 of each stack of semiconductor dice 138, which may better protect the side surfaces 126 of each first semiconductor die 114 during subsequent handling and which may reduce the likelihood that the protective material 152 will delaminate from a shoulder portion of the active surface 116 of each first semiconductor die 114 surrounding the additional semiconductor dice 140 stacked thereon when compared to conventional, wafer-level processed semiconductor device packages.

In other words, methods of making semiconductor device packages may involve attaching first semiconductor dice in mutually laterally spaced locations to a carrier wafer with an attachment material having conductive elements disposed therein at the attachment locations. One or more additional semiconductor dice may be stacked on each first semiconductor die of the plurality of first semiconductor dice to form stacks of semiconductor dice. An adjacent additional semiconductor die may be physically and electrically connected to each first semiconductor die of each stack. Each first semiconductor die may be physically and electrically connected to conductive elements at the respective attachment location. A protective material may be positioned between the stacks of semiconductor dice and over at least sides of each stack of semiconductor dice and in contact with the attachment material. The carrier wafer may be detached from each stack of semiconductor dice. Each stack of semiconductor dice may be separated from each other stack of semiconductor dice by cutting only through the protective material between stacks of semiconductor dice.

Semiconductor device packages 180 formed in accordance with the methods of this disclosure may include a stack of semiconductor dice 138. The stack of semiconductor dice 138 may include a first, or base, semiconductor die 114 having an active surface 116 on a first side of the base semiconductor die 114 and an inactive surface 118 on a second, opposite side of the base semiconductor die 114. Side surfaces 126 defining a periphery of the base semiconductor die 114 may extend between the active and inactive surfaces 116 and 118. At least a second semiconductor die 140 may be located over, and electrically connected to, the first semiconductor die 114 proximate the active surface 116 to form the stack of semiconductor dice 138. For example, a plurality of additional semiconductor dice 140 may be located over, and electrically connected to, the first semiconductor die 114 to form the stack of semiconductor dice 138. A total number of additional semiconductor dice 140 located over the first semiconductor die 114 may be, for example, at least four. More specifically, the total number of additional semiconductor dice 140 located over the first semiconductor die 114 may be, for example, eight, twelve, sixteen, or more. Conductive elements 132 configured to electrically connect the semiconductor device package 180 to another device or system may be located on the inactive surface of the first semiconductor die 114.

A protective material 152 may be located over the additional semiconductor dice 140 and may extend along side surfaces 126 of the first semiconductor die 114 to proximate the inactive surface 118. For example, the protective material 152 may be a contiguous, uniform material positioned in a single application to extend continuously over the additional semiconductor dice 140 on a side of the topmost additional semiconductor die 140 opposite the first semiconductor die 114, around peripheries of the additional semiconductor dice 140, over and in contact with a portion of the active surface 116 of the first semiconductor die 114 proximate a periphery of the first semiconductor die 114, and along and in contact with side surfaces 126 of the first semiconductor die 114. As a specific, nonlimiting example, the protective material 152, which may be a uniform, at least substantially homogeneous material, may be in contiguous contact with the exposed surface of the topmost additional semiconductor die 140 of the stack of semiconductor dice 138 on a side of the topmost semiconductor die 140 opposite the first semiconductor die, with exposed portions of side surfaces 184 of the additional semiconductor dice 140, with a shoulder portion of the active surface 116 of the first semiconductor die 114 extending laterally beyond the peripheries of the additional semiconductor dice 140, and with at least substantially an entire surface area of side surfaces 126 of the first semiconductor die 114. In some embodiments, the protective material 152 may not project beyond the side surfaces 126 of the first semiconductor die 114. For example, a bottom surface of the protective material 152 may be at least substantially coplanar with the inactive surface 118 of the first semiconductor die 114. Optionally, protective material 152 may not extend over the upper surface of uppermost additional semiconductor die 140, to facilitate heat transfer from the stack 138 to a heat sink structure through a thermal interface material (TIM). Of course, in such cases the uppermost additional die 140 may be electrically isolated from the heat sink structure using a high thermal conductivity dielectric.

In other words, semiconductor device packages may include a first semiconductor die and at least one additional semiconductor die stacked over and electrically connected to the first semiconductor die. A protective material may extend contiguously over at least sides of the at least one additional semiconductor die, over a shelf portion of the first semiconductor die extending laterally beyond the sides of the at least one additional semiconductor die, and over side surfaces of the first semiconductor die to at least proximate a surface of the first semiconductor die facing away from the at least one additional semiconductor die. Conductive elements electrically connected to and protruding from the surface of the first semiconductor die may face away from the at least one additional semiconductor die.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure, as contemplated by the inventors.

What is claimed is:

1. A method of making a semiconductor device package, comprising:
    attaching a first semiconductor die to a carrier wafer by placing an attachment material comprising a thermoplastic material configured to withstand temperatures of at least 150° C. without degradation between the first semiconductor die and the carrier wafer;
    stacking at least one additional semiconductor die on and in direct electrical contact with the first semiconductor die on a side of the first semiconductor die opposite the carrier wafer and centrally positioned such that at least one shelf portion of the first semiconductor die extends laterally past at least one side surface of the at least one additional semiconductor die;
    positioning a protective material over at least sides of the stack of semiconductor dice, a portion of the protective material extending contiguously along all side surfaces of the at least one additional semiconductor die and along all side surfaces of the first semiconductor die to a location in contact with the attachment material at least proximate a surface of the first semiconductor die facing the carrier wafer; and
    detaching the carrier wafer from the first semiconductor die.

2. The method of claim 1, wherein detaching the carrier wafer from the first semiconductor die comprises removing material of the carrier wafer from a side of the carrier wafer opposite the first semiconductor die until the carrier wafer is entirely removed.

3. The method of claim 2, wherein removing the material of the carrier wafer comprises:
    removing a first portion of the carrier wafer at a first rate; and
    removing a second portion of the carrier wafer at a second, different rate.

4. The method of claim 3, further comprising:
removing the first portion of the carrier wafer at the first rate by an abrasive process; and
removing the second portion of the carrier wafer at the second rate by etching.

5. The method of claim 1, wherein detaching the carrier wafer from the first semiconductor die comprises exposing at least the first semiconductor die and the carrier wafer to an elevated temperature to soften the attachment material and sliding the carrier wafer and the first semiconductor die laterally relative to one another until the carrier wafer is removed, ablating a region of attachment material between the first semiconductor die and the carrier wafer utilizing a laser to remove at least a portion of the attachment material, or exposing a region of attachment material between the first semiconductor die and the carrier wafer to a solvent material to dissolve at least a portion of the attachment material, and subsequently mechanically separating the first semiconductor die from the carrier wafer.

6. The method of claim 5, further comprising reusing the carrier wafer by attaching the carrier wafer to another first semiconductor die with an attachment material after detaching the carrier wafer from the first semiconductor die.

7. The method of claim 1, further comprising selecting the first semiconductor die to comprise a known good die.

8. The method of claim 1, further comprising embedding conductive elements in the attachment material prior to attaching the first semiconductor die to the carrier wafer.

9. The method of claim 8, further comprising physically and electrically connecting the conductive elements to the first die before positioning the protective material.

10. The method of claim 9, further comprising removing the attachment material after removing the carrier wafer.

11. The method of claim 10, wherein removing the attachment material comprises dissolving the attachment material in a solvent.

12. The method of claim 1, wherein stacking at least one additional semiconductor die on the first semiconductor die comprises stacking at least four additional semiconductor dice.

13. The method of claim 1, wherein attaching the first semiconductor die to the carrier wafer comprises attaching a logic die or a SoC die to the carrier wafer and wherein stacking the at least one additional semiconductor die on the first semiconductor die comprises stacking at least one memory die on the logic die or SoC die.

14. The method of claim 1, further comprising removing a portion of the protective material proximate the at least one additional semiconductor die and the first semiconductor die and laterally spaced from a periphery of the first semiconductor die as defined by the side surfaces of the first semiconductor die to leave another portion of the protective material surrounding the at least one additional semiconductor die and the first semiconductor die.

15. The method of claim 1, further comprising physically and electrically connecting the at least one additional semiconductor die to the first semiconductor die with conductive structures extending between facing surfaces of the first semiconductor die and the at least one additional semiconductor die.

16. The method of claim 15, further comprising introducing a dielectric underfill material between the facing surfaces of the first semiconductor die and the at least one additional semiconductor die before positioning the protective material.

17. A method of making semiconductor device packages, comprising:

attaching first semiconductor dice in mutually laterally spaced locations to a carrier wafer with an attachment material having conductive elements disposed therein at the attachment locations;
stacking one or more additional semiconductor dice on each first semiconductor die of the plurality of first semiconductor dice to form stacks of semiconductor dice;
physically and electrically connecting an adjacent additional semiconductor die to each first semiconductor die of each stack;
physically and electrically connecting each first semiconductor die to conductive elements at the respective attachment location;
positioning a protective material between the stacks of semiconductor dice and contiguously over at least sides of each stack of semiconductor dice and in contact with the attachment material;
detaching the carrier wafer from each stack of semiconductor dice;
removing the attachment material from about the conductive elements; and
after removing the attachment material from about the conductive elements, separating each stack of semiconductor dice from each other stack of semiconductor dice by cutting only through the protective material between stacks of semiconductor dice.

18. A semiconductor device assembly, comprising:
a carrier wafer;
a first semiconductor die adhered to the carrier wafer by an attachment material having conductive elements disposed therein, the attachment material comprising a thermoplastic material configured to withstand temperatures of at least 150° C. without degradation between the first semiconductor die and the carrier wafer;
at least one additional semiconductor die stacked over and electrically connected to the first semiconductor die;
a protective material extending contiguously over at least sides of the at least one additional semiconductor die, over a shelf portion of the first semiconductor die extending laterally beyond the sides of the at least one additional semiconductor die, and over side surfaces of the first semiconductor die to at least proximate a surface of the first semiconductor die facing away from the at least one additional semiconductor die; and
conductive elements electrically connected to and protruding from the surface of the first semiconductor die facing away from the at least one additional semiconductor die.

19. The semiconductor device package of claim 18, wherein the first semiconductor die comprises a logic die or a SoC die, and the at least one additional semiconductor die comprises at least four memory dice.

20. A method of making a semiconductor device package, comprising:
attaching a first semiconductor die to a carrier wafer with an attachment material;
stacking at least one additional semiconductor die on and in direct electrical contact with the first semiconductor die on a side of the first semiconductor die opposite the carrier wafer and centrally positioned such that at least one shelf portion of the first semiconductor die extends laterally past at least one side surface of the at least one semiconductor die;
positioning a protective material over at least sides of the stack of semiconductor dice, a portion of the protective material extending contiguously along all side surfaces of the at least one additional semiconductor die and along all side surfaces of the first semiconductor die to a location in contact with the attachment material at least proximate a surface of the first semiconductor die facing the carrier wafer; and detaching the carrier wafer from the first semiconductor die by removing a first portion of the carrier wafer at a first rate and removing a second portion of the carrier wafer at a second, different rate from a side of the carrier wafer opposite the first semiconductor die until the carrier wafer is entirely removed.

21. A method of making a semiconductor device package, comprising:

embedding conductive elements in an attachment material;

after embedding the conductive elements in the attachment material, attaching a first semiconductor die to a carrier wafer with the attachment material;

stacking at least one additional semiconductor die on and in direct electrical contact with the first semiconductor die on a side of the first semiconductor die opposite the carrier wafer and centrally positioned such that at least one shelf portion of the first semiconductor die extends laterally past at least one side surface of the at least one semiconductor die;

physically and electrically connecting the conductive elements to the first die;

after physically and electrically connecting the conductive elements to the first die, positioning a protective material over at least sides of the stack of semiconductor dice, a portion of the protective material extending contiguously along all side surfaces of the at least one additional semiconductor die and along all side surfaces of the first semiconductor die to a location in contact with the attachment material at least proximate a surface of the first semiconductor die facing the carrier wafer;

detaching the carrier wafer from the first semiconductor die; and after detaching the carrier wafer from the first semiconductor die, removing the attachment material by dissolving the attachment material in a solvent.

* * * * *